(12) United States Patent
Burdt et al.

(10) Patent No.: US 12,360,466 B2
(45) Date of Patent: Jul. 15, 2025

(54) MAINTENANCE OF MODULES FOR LIGHT SOURCES USED IN SEMICONDUCTOR PHOTOLITHOGRAPHY

(71) Applicant: Cymer, LLC, San Diego, CA (US)

(72) Inventors: Russell Allen Burdt, San Diego, CA (US); Kumar Raja Guvindan Raju, San Diego, CA (US); Matthew Minakais, San Diego, CA (US); David Wesley Manley, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 142 days.

(21) Appl. No.: 18/281,676

(22) PCT Filed: Feb. 24, 2022

(86) PCT No.: PCT/US2022/017725
§ 371 (c)(1),
(2) Date: Sep. 12, 2023

(87) PCT Pub. No.: WO2022/197415
PCT Pub. Date: Sep. 22, 2022

(65) Prior Publication Data
US 2024/0152063 A1    May 9, 2024

Related U.S. Application Data

(60) Provisional application No. 63/188,020, filed on May 13, 2021, provisional application No. 63/162,249, filed on Mar. 17, 2021.

(51) Int. Cl.
*G03F 7/20*      (2006.01)
*G03F 7/00*      (2006.01)

(52) U.S. Cl.
CPC ...... *G03F 7/70975* (2013.01); *G03F 7/70025* (2013.01); *G03F 7/70525* (2013.01); *G03F 7/70533* (2013.01)

(58) Field of Classification Search
CPC ............. G03F 7/70975; G03F 7/70025; G03F 7/70525; G03F 7/70533; G03F 7/70008; G05B 23/0283; G06N 20/20
See application file for complete search history.

(56) References Cited

U.S. PATENT DOCUMENTS

2008/0205472 A1  8/2008  Dunstan et al.
2015/0180192 A1  6/2015  Tsushima et al.
(Continued)

FOREIGN PATENT DOCUMENTS

| TW | 201725526 A | 7/2017 |
| WO | 2017059022 A1 | 4/2017 |
| WO | 2020161865 A1 | 8/2020 |

OTHER PUBLICATIONS

Ademu-John, C. and Conley, C., Lowering Cost of Ownership for Lithography Equipment, 2008 IEEE/SEMI Advanced Semiconductor Manufacturing Conference, 2008, pp. 243-248.
(Continued)

*Primary Examiner* — Mesfin T Asfaw
(74) *Attorney, Agent, or Firm* — DiBerardino McGovern IP Group LLC

(57) ABSTRACT

Systems for maintaining light sources for semiconductor photolithography in which a module making up part of the light source is evaluated at various pulse counts to produce a binary prediction as to whether the module is sufficiently likely to operate without failure in an ensuing sequence of pulses. The binary prediction may be made by a machine learning model trained on metrics extracted from measurements taken on deinstalled modules. A group of models, each trained differently, can be made available according to a selection made by the user or according to the maintenance objectives of the user.

23 Claims, 10 Drawing Sheets

(56) References Cited

U.S. PATENT DOCUMENTS

2018/0226153 A1* 8/2018 Rubenstein ............ G06N 20/20
2021/0333788 A1* 10/2021 Abe ....................... G06N 20/00

OTHER PUBLICATIONS

Wiebo van Toledo, European International Searching Authority, International Search Report and Written Opinion, corresponding PCT Application No. PCT/US2022/017725, mailed Jun. 9, 2022, 16 pages total.

* cited by examiner

MAINTENANCE OF MODULES FOR LIGHT SOURCES USED IN SEMICONDUCTOR PHOTOLITHOGRAPHY

CROSS-REFERENCE TO RELATED APPLICATIONS

This application claims priority to U.S. Application No. 63/162,249, filed Mar. 17, 2021, titled MAINTENANCE OF MODULES FOR LIGHT SOURCES USED IN SEMICONDUCTOR PHOTOLITHOGRAPHY; and U.S. Application No. 63/188,020, filed May 13, 2021, titled MAINTENANCE OF MODULES FOR LIGHT SOURCES USED IN SEMICONDUCTOR PHOTOLITHOGRAPHY, both of which are incorporated herein in their entireties by reference.

TECHNICAL FIELD

The subject matter disclosed herein relates to maintenance of light sources such as those used for integrated circuit photolithographic manufacturing processes.

BACKGROUND

Laser radiation for semiconductor photolithography is typically supplied by a system referred to as a light source. These light sources produce radiation as a series of pulses at specified repetition rates, for example, in the range of about 500 Hz to about 6 kHz. They conventionally have expected useful lifetimes measured in terms of the number of pulses they are projected to be able to produce before requiring repair or replacement, typically expressed as billions of pulses.

One system for generating laser radiation at frequencies useful for semiconductor photolithography (deep-ultraviolet (DUV) wavelengths) involves use of a Master Oscillator Power Amplifier (MOPA) dual-gas-discharge-chamber configuration. This configuration has two chambers, a master oscillator chamber (MO chamber) and a power amplifier chamber (PA chamber). These chambers and many other system components may be regarded as being modules, and the light source overall may be regarded as an ensemble of modules. Each module will in general have a lifetime that is shorter than the lifetime of the overall system. Thus, over the course of the lifetime of the system, the health of individual modules must be evaluated to determine if they should be repaired or replaced.

The timing for maintenance of modules is determined according to a maintenance strategy. The earliest maintenance strategy is unplanned maintenance (run to failure), in which no maintenance is undertaken until a module breakdown occurs. Using this strategy, the utilization of a component may be increased to some extent, but the unplanned failure of a module can have a significant negative economic impact on an entire production line, resulting in unplanned downtime and costs.

Another maintenance strategy is preventative maintenance, in which maintenance actions are carried out according to a planned schedule based on chronological time (i.e., time since put in service) or machine time and the components are maintained at periodic increments to reduce unexpected machine breakdowns. However, a regular inspection/maintenance practice can needlessly incur long suspension times and high maintenance costs. Another maintenance strategy is condition-based maintenance in which maintenance actions are taken after determination of the existence one or more conditions indicating a degradation of the operation of the module.

Predictive maintenance (PdM) is a maintenance strategy designed to monitor the condition of in-service equipment to predict when equipment will fail. The future behavior/condition of machine components is approximated, which makes it possible to optimize maintenance tasks (e.g., prognostic health monitoring). Accordingly, machine downtime and maintenance costs can be reduced significantly while undertaking maintenance as infrequently as possible. PdM systems allow advance detection of pending failures and enable timely pre-failure interventions, utilizing prediction tools based on historical data.

Also, typically the end users of such systems and field technicians of the tool manufacturers manually monitor tools using reports and interfaces which are reactive in the sense that they are based on historic and current performance. Moreover, these reports and interfaces tend to be global or universal in the sense that they use global as opposed to customer-specific parameters to judge a tool's ability to meet maintenance intervals. These global parameters and reports are generally not customizable on a per-customer basis.

It is desirable to implement a maintenance strategy for a light source having module lifetimes measured in billions of pulses in manner that yields the highest availability possible without affecting technical performance of the light source.

SUMMARY

The following presents a simplified summary of one or more embodiments in order to provide a basic understanding of the present invention. This summary is not an extensive overview of all contemplated embodiments and is not intended to identify key or critical elements of all embodiments nor delineate the scope of any or all embodiments. Its sole purpose is to present some concepts of one or more embodiments in a simplified form as a prelude to the more detailed description that is presented later.

According to an aspect of an embodiment, modules are evaluated at various pulse milestones. At each evaluation, a model is used to render a binary (true/false) prediction of whether the module is likely to operate without failure during a prediction increment made up of a given number of immediately ensuing pulses. In other words, the model predicts if the module will likely survive another prediction increment or likely fail before the end of the prediction increment. The model may be a mathematical model of the component or a model trained using machine learning.

According to another aspect of an embodiment, there is disclosed a method of maintaining a light source for semiconductor photolithography, the light source comprising one or more modules, the method comprising determining whether a module which is one of the one or more modules is due for an initial evaluation based at least in part on a first number of pulses the module has participated in generating, performing the initial evaluation to determine whether the module has at least a minimum probability of operating without a failure in a prediction increment measured as a second number of pulses, and generating a module failure alert for the module if the initial evaluation determines that the module does not have at least the minimum probability of operating without a failure in the prediction increment or leaving the module in service if the initial evaluation determines that the module has at least the minimum probability of operating without a failure in the prediction increment.

The method may further comprise deinstalling the module if the initial evaluation determines that the module does not have at least the minimum probability of operating without a failure in the prediction increment. The first number may be about ten billion pulses. The second number may be about two billion pulses.

The method may further comprise steps after leaving the module in service of determining whether the module is due for an additional evaluation based at least in part based on a third number of pulses the module has participated in generating since the initial evaluation, performing the additional evaluation to determine whether the module has at least a minimum probability of operating without a failure in a second prediction increment measured as a fourth number of pulses, and generating a module failure alert for the module if the additional evaluation determines that the module does not have at least the minimum probability of operating without a failure in the second prediction increment or leaving the module in service if the additional evaluation determines that the module has at least the minimum probability of operating without a failure in the second prediction increment. After these further steps, the method may further comprise deinstalling the module if the additional evaluation determines that the module does not have at least the minimum probability of operating without a failure in the second prediction increment. The third number may be about 0.1 billion pulses. The fourth number may be about two billion pulses.

Performing the initial evaluation may comprise using a model. The model may be an analytical model. The model may be a trained model developed through machine learning by supplying feature data to train the trained model and the trained model makes the initial determination based on at least some of the feature data. The module may comprise a master oscillator chamber module in which case the feature data may include a number of master oscillator-related energy batch quality events in an immediately previous 100 million pulses and/or average master oscillator energy in an immediately previous 100 million pulses.

According to another aspect of an embodiment, there is disclosed a computer-implemented method comprising determining, by a computing device, whether a module which is one of one or more modules of a photolithography light source is due for an initial evaluation based at least in part based on a first number of pulses the module has participated in generating, performing, by the computing device, the initial evaluation to determine whether the module has at least a minimum probability of operating without a failure in a prediction increment measured as a second number of pulses, and providing, by the computing device, an indication that the module should be deinstalled if the initial evaluation determines that the module does not have at least the minimum probability of operating without a failure in the prediction increment or providing, by the computing device, an indication that the module should be left in service if the initial evaluation determines that the module has at least the minimum probability of operating without a failure in the prediction increment.

According to another aspect of an embodiment, there is disclosed a non-transitory computer-readable storage medium comprising executable instructions to cause a processor to perform operations, the instructions comprising instructions to determine whether a module which is one of one or more modules of a photolithography light source is due for an initial evaluation based at least in part based on a first number of pulses the module has participated in generating, perform the initial evaluation to determine whether the module has at least a minimum probability of operating without a failure in a prediction increment measured as a second number of pulses, and provide an indication that the module should be deinstalled if the initial evaluation determines that the module does not have at least the minimum probability of operating without a failure in the prediction increment or provide an indication that the module should be left in service if the initial evaluation determines that the module has at least the minimum probability of operating without a failure in the prediction increment.

According to another aspect of an embodiment, there is disclosed a method of maintaining a light source for semiconductor photolithography, the light source comprising one or more modules, the method comprising identifying for evaluation a module which is one of the one or more modules, performing an evaluation to determine whether the module has at least a minimum probability of operating without a failure in a prediction increment measured as a second number of pulses, and generating a module failure alert for the module if the initial evaluation determines that the module does not have at least the minimum probability of operating without a failure in the prediction increment or leaving the module in service if the initial evaluation determines that the module has at least the minimum probability of operating without a failure in the prediction increment. The method may further comprise deinstalling the module if the initial evaluation determines that the module does not have at least the minimum probability of operating without a failure in the prediction increment. The first number may be on the order of ten billion pulses. The second number may be on the order of two billion pulses. Performing the evaluation may comprise using a trained model developed through machine learning by supplying feature data to train the trained model and wherein the trained model determines whether the module has at least a minimum probability of operating without a failure in a prediction increment measured as a second number of pulses based on at least some of the feature data.

In accordance with another aspect of an embodiment, there is disclosed a method of maintaining a light source for semiconductor photolithography, the light source comprising one or more modules, the method comprising acquiring user information indicative of a user's relative prioritization of two or more maintenance preferences, training at least two models including a first model based on a first relative prioritization of the two or more maintenance preferences and a second model based on a second relative prioritization of the two or more maintenance preferences, performing an evaluation to determine whether a module failure alert should be generated, the evaluation being performed using one of the at least two models based on which model relative prioritization most closely aligns with the user's relative prioritization, and generating a module failure alert for the module if the evaluation determines that a module failure alert should be generated. Performing an evaluation using one of the at least two models based on which model relative prioritization most closely aligns with the user's relative prioritization may comprise performing an evaluation using the one of the at least two models selected by the user. The maintenance preferences may include output maximization and avoidance of unforeseen downtime. The method may further comprise indicating that the module remain in service if the evaluation determines that a module failure alert should not be generated. The method may further comprise determining whether the module is due for an evaluation based at least in part on a number of pulses the module has participated in generating. Performing an evaluation to determine whether a module failure alert should be generated may comprise selecting a model from the at least two models based on the user's relative prioritization, to render a binary (true/false) determination on whether a module failure alert should be generated. The method may further comprise performing a maintenance operation on the module if the evaluation determines that a module failure alert should be generated. Performing the maintenance operation may comprise deinstalling the module. Performing the maintenance operation may comprise repairing the module. The models may be trained models developed through machine learning by supplying feature data to train the trained models and a selected one of the trained models makes the determination based on at least some of the feature data.

In accordance with another aspect of an embodiment, there is disclosed computer-implemented method comprising storing, using a computing device, user information indicative of a user's relative prioritization of two or more maintenance preferences, training, using a computing device, at least two models including a first model based on a first relative prioritization of the two or more maintenance preferences and a second model based on a second relative prioritization of the two or more maintenance preferences, selecting, using a computing device, one of the models as a selected model based on the user information, performing, using the selected model on a computing device by, an evaluation to determine whether a module failure alert should be generated, and either providing, by the computing device, an indication that the module should be deinstalled if the evaluation determines that the a module failure alert should be generated or providing, by the computing device, an indication that the module should be left in service if the evaluation determines that a module failure alert should not be generated. The maintenance preferences may include output maximization and avoidance of unforeseen downtime.

In accordance with another aspect of an embodiment, there is disclosed a non-transitory computer-readable storage medium comprising executable instructions to cause a processor to perform operations, the instructions comprising instructions to store user information indicative of a user's relative prioritization of two or more maintenance preferences, train at least two models including a first model based on a first relative prioritization of the two or more maintenance preferences and a second model based on a second relative prioritization of the two or more maintenance preferences, select one of the models as a selected model based on the user information, perform using the selected model an evaluation to determine whether a module failure alert should be generated, and either provide an indication that the module should undergo a maintenance procedure if the evaluation determines that the a module failure alert should be generated or provide an indication that the module should be left in service if the evaluation determines that a module failure alert should not be generated. The maintenance preferences may include output maximization and avoidance of unforeseen downtime.

In accordance with another aspect of an embodiment, there is disclosed a system for maintaining a light source for semiconductor photolithography, the light source comprising one or more modules, the system comprising a user preference data storage unit adapted to store user preference data on user relative prioritizations of two or more maintenance preferences, an evaluation timing unit adapted to determine whether a module which is one of the one or more modules is due for an evaluation based at least in part on a first number of pulses the module has participated in generating, a model training unit adapted to train a first model based on a first relative prioritization of the two or more maintenance preferences and a second model based on a second relative prioritization of the two or more maintenance preferences, a model selection unit adapted to select one of the models as a selected model based on the user preference data, a binary prediction unit arranged to be responsive to the evaluation timing unit and the user preference input unit and adapted to perform the evaluation by determining using the selected model whether a module failure alert should be generated, and a module failure alert generating unit arranged to be responsive to the binary prediction unit and adapted to generate the module failure alert for the module if the evaluation determines that the a module failure alert should be generated. The maintenance preferences may include output maximization and avoidance of unforeseen downtime. The module failure alert generating unit may be additionally configured to generate a positive no fault indication if the binary prediction unit determines that a module failure alert should not be generated.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
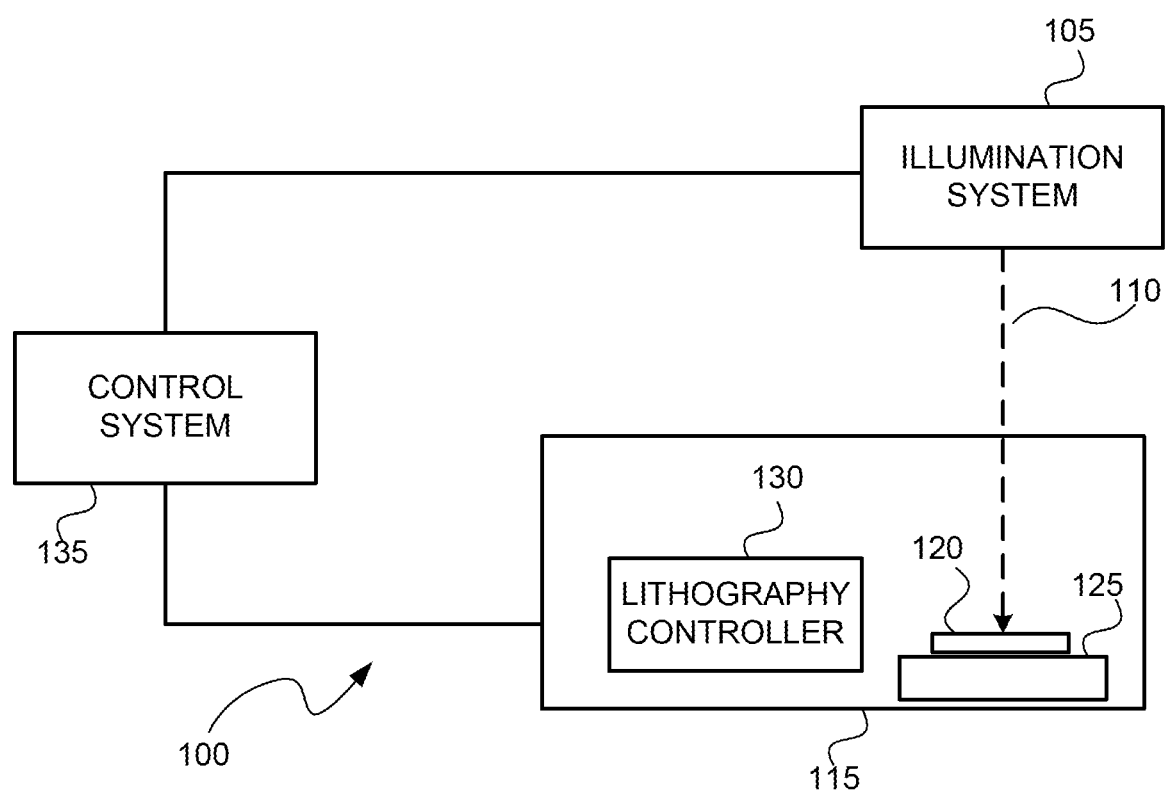
FIG. 1 shows a schematic, not to scale, view of an overall broad conception of a photolithography system according to an aspect of the disclosed subject matter.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be realized without adopting the specific design details described below. In other instances, well-known structures and devices are shown in block diagram form in order to facilitate description of one or more embodiments.

The following presents a simplified summary of one or more embodiments in order to provide a basic understanding of the embodiments. This summary is not an extensive overview of all contemplated embodiments and is not intended to identify key or critical elements of all embodiments nor delineate the scope of any or all embodiments.

The embodiment(s) described, and references in the specification to "one embodiment", "an embodiment", "an exemplary embodiment," "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Referring to FIG. 1, a photolithography system 100 includes an illumination system 105. As described more fully below, the illumination system 105 produces a pulsed light beam 110 and directs it to a photolithography exposure apparatus or scanner 115 that patterns microelectronic features on a wafer 120. The wafer 120 is placed on a wafer table 125 constructed to hold wafer 120 and connected to a positioner configured to position the wafer 120 accurately in accordance with certain parameters.

The photolithography system 100 may use a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths.

The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables an image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the mask used, and other factors that affect the exposure. During lithography, a plurality of pulses of the light beam 110 illuminates the same area of the wafer 120 to together constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also can include components to enable wireless communication including Bluetooth, NFC, and Wi-Fi. In particular, the control system 105 may include components that permit the control system to exchange data, instructions, etc. with the cloud. The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate outputs. Generally, the processors receive instructions and data from the memory. Any of the foregoing may be supplemented by, or incorporated in, especially designed ASICs (application-specific integrated circuits). The control system 135 can be centralized or be partially or wholly distributed throughout the photolithography system 100.

Figure 2:
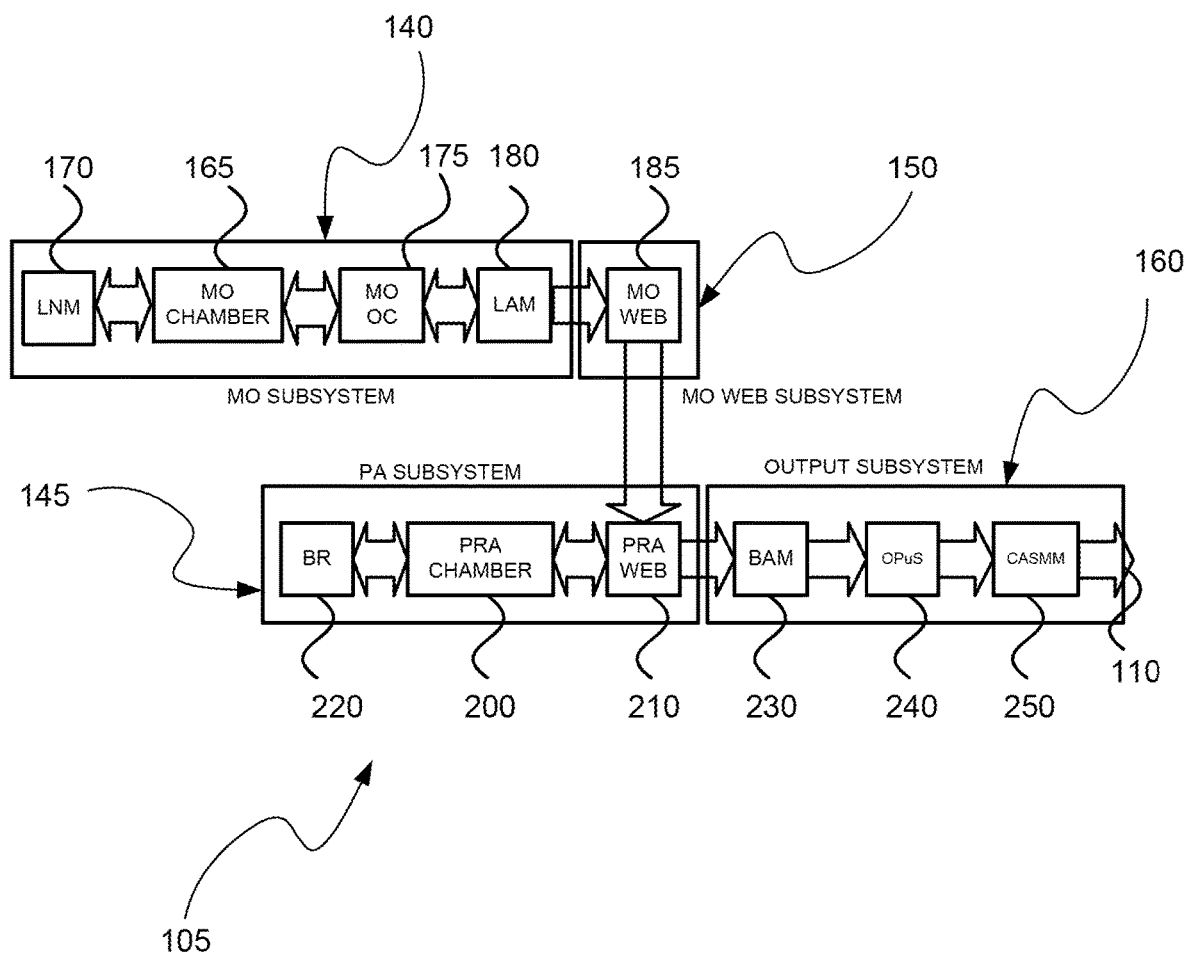
FIG. 2 shows a schematic, not to scale, view of an overall broad conception of an illumination system according to an aspect of the disclosed subject matter.

Referring to FIG. 2, an exemplary illumination system 105 is a pulsed laser source that produces a pulsed laser beam as a light beam 110. FIG. 2 depicts one particular assemblage of components or modules and optical path strictly for purposes of facilitating the description of the broad principles of the invention in general, and it will be apparent to one having ordinary skill in the art that the principles of the invention may be advantageously applied to lasers having other modules and configurations.

The illumination system 105 may include, e.g., a solid state or gas discharge seed laser system 140, a power amplification ("PA") stage, e.g., a power ring amplifier ("PRA") stage 145, relay optics 150, and laser system output subsystem 160. The seed system 140 may include, e.g., a master oscillator ("MO") chamber module 165, in which electrical discharges between electrodes (not shown) may cause lasing gas discharges in a lasing gas to create an inverted population of high energy molecules, e.g., including Ar, Kr, or Xe to produce relatively broad band radiation that may be line narrowed to a relatively very narrow bandwidth and center wavelength selected in a line narrowing module ("LNM") 170, as is known in the art.

The seed laser system 140 may also include a master oscillator output coupler ("MO OC") 175, which may comprise a partially reflective mirror, forming with a reflective grating (not shown) in the LNM 170, an oscillator cavity in which the seed laser 140 oscillates to form the seed laser output pulse, i.e., forming a master oscillator ("MO"). The system may also include a line-center analysis module ("LAM") 180. The LAM 180 may include, for example, an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a PRA lasing chamber module 200, which may also be an oscillator, e.g., formed by seed beam injection and output coupling optics (not shown) that may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion of the light beam for metrology purposes, e.g., to measure the output bandwidth and pulse energy. The laser output light beam of pulses then passes through an optical pulse stretcher ("OPuS") 240 and an output combined autoshutter metrology module ("CASMM") 250, which may also be the location of a pulse energy meter. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250.

The overall availability of the light source (e.g., illumination system 105) is the direct result of the respective availabilities of individual modules making up the light source. In other words, the light source cannot be available unless all of the critical modules making up the light source are available. This necessitates the use of some form of a maintenance strategy. In addition to the maintenance strategies mentioned above, one approach to maintenance of the light source is referred to as umbrella maintenance, in which a group of multiple modules, some of which may not have failed, are all replaced at the same time in order to optimize light source availability and thereby fab productivity.

Using an umbrella maintenance strategy, each module is assumed to have a minimum lifetime, or a lifetime that is an integer multiple of another module lifetime. For example, the nominal lifetime of module A is six months and the nominal lifetime of module B is eighteen months. In such a scenario, module B would be replaced with every third replacement of module A.

An umbrella maintenance strategy is disrupted if an actual module lifetime is less than a rated or expected minimum lifetime, which can also cause a cascading impact by breaking the synchronous maintenance schedule for other modules. A module may also have a potential or actual lifetime that exceeds its rated minimum lifetime, and in these cases umbrella maintenance involves the deinstallation of a module which is still capable of providing additional satisfactory operation. System maintenance events require that a light source be taken out of production. Thus, umbrella maintenance may cause an unnecessary interruption in productivity when the fab operations otherwise could have continued.

There is a need for an approach to maintenance of the light source which is based on the use of a system to provide validated module failure alerts in order to augment existing field service operations, that is, to give field engineers the final decision regardless of any model outcome. For some applications it would be beneficial if these systems were fully-automated and provided assessments in real-time.

Figure 3:
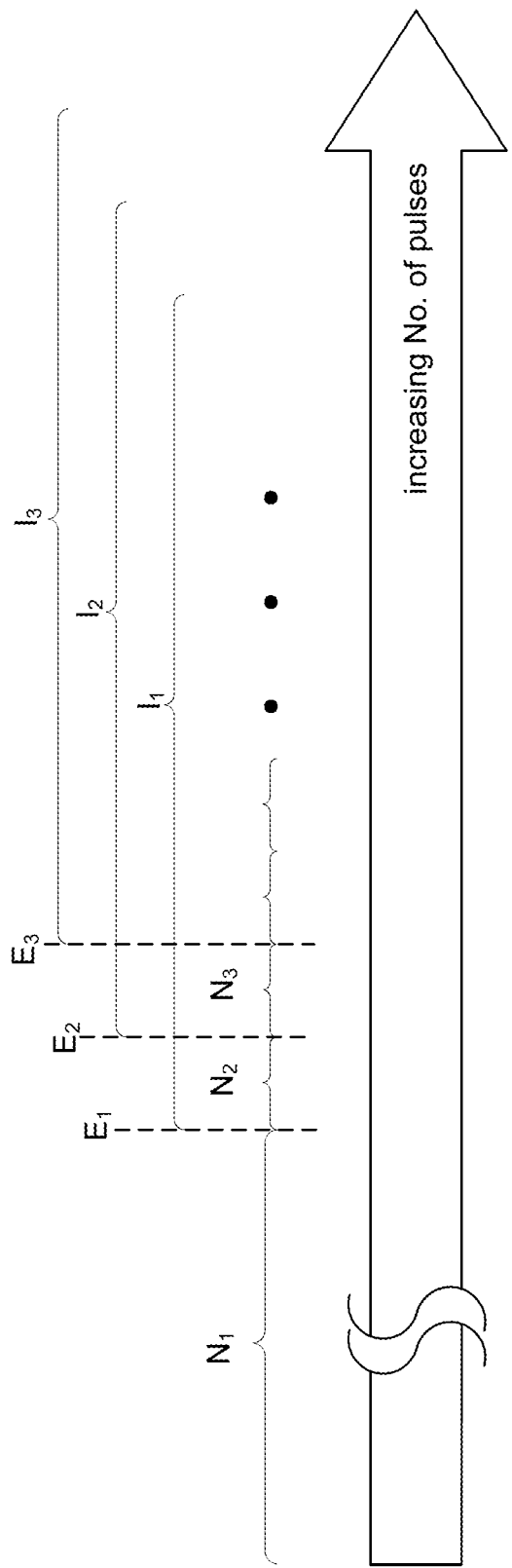
FIG. 3 is a diagram illustrating a maintenance procedure according to an aspect of an embodiment.

According to an aspect of an embodiment, as shown in FIG. 3, a module is first evaluated after an increment with a length measured in terms of a number of pulses $N_1$. The number $N_1$ is selected to be well within the expected lifetime of the module with a high degree of confidence. At evaluation $E_1$ a determination is made as to whether the probability $P_1$ that the module will fail during a prediction increment of $I_1$ additional pulses is less than some predetermined value $P_0$. Or, equivalently, a determination is made as to whether the probability $P_1$ that the module will survive during a prediction increment $I_1$ is greater than some predetermined value $P_0$.

Note that this is a binary yes/no, true/false determination. The determination does not yield a numerical value of a continuous variable. It merely determines whether the value is in a given range. PdM systems, however, typically return results such as remaining useful lifetime (RUL) in terms of a continuous variable. Results in this form may be less useful in a system designed to perform maintenance on a semiconductor photolithography system. A binary outcome can offer higher accuracy because the space of possible outcomes is smaller, i.e., either true or false versus any one of a number of possible values in given range.

If $P_1 > P_0$ then a module failure alert is generated, and the module may be maintained, i.e., replaced or serviced. If the determination made as a result of evaluation $E_1$ indicates that $P_1 < P_0$, then the module is left in service until at least the next evaluation $E_2$ after $N_2$ additional pulses.

At evaluation $E_2$ a determination is made as to whether the probability $P_2$ that the module will fail during a prediction increment $I_2$ is less than some predetermined value which may be $P_0$. If $P_0 < P_2$ then the module is replaced. If the determination made as a result of evaluation $E_2$ indicates that $P_2 < P_0$, then the module is left in service until at least the next evaluation $E_3$ after $N_3$ additional pulses. This process is repeated until the module is replaced, at which point the process is re-initiated for the replacement module.

For example, if the prediction increment is two billion pulses, the process may first evaluate a module at about 10 billion pulses (Bp) and predict if the module will survive or fail in a prediction increment of about 2 Bp (i.e., to about 12 Bp). The same module may be evaluated at about 10.1 Bp to make another binary prediction regarding failure or survival before about 12.1 Bp, and so on until the module requires a maintenance operation, e.g., deinstall, repair or service.

It will be noted that here and elsewhere in this specification including in the claims that pulse counts are specified as being "about" a certain value. One of ordinary skill in the art will appreciate a certain amount of latitude permitted in performing an operation based on a predetermined number of pulse counts between that predetermined number and the actual number of pulse counts at which the operation is performed. In other words, an operation which is specified to be performed at 10 Bp can be equally well performed at an actual pulse count between, e.g., 9.9 Bp to 10.1 Bp. So, for the purposes of this description, the adverb "about" should be construed to mean close enough to the stated nominal value that maintenance is not adversely affected.

Note that in the foregoing example, the initial evaluation increment is significantly longer than the later evaluation increments. It will be appreciated that this is essentially an arbitrary design choice. Also, in the example above, the later evaluation increments are all of the same length. Also, in the example above, the prediction increments are all of the same length. In general, either or both of these increments can be set by the equipment manufacturer or the end user and may vary as a function of, for example, chronological age, cumulative pulse count (i.e., pulse count since put in service) or a feature indicating module health. Thus, depending on cumulative pulse count, the evaluation increment may be shorter or longer and the prediction increment may be shorter or longer. For example, as the module ages (chronological time or pulse count) the evaluation increment or the prediction increment or both may be made shorter to account for a greater likelihood of module failure with age. It will be appreciated that the evaluation increments and the prediction increments could be of differing lengths. Also, in the foregoing example, the threshold probability of failure is the same for every prediction increment. It will be apparent that different threshold probabilities can be used. Also, in the foregoing example, the prediction increments are all of the same length. Again, it will be apparent that prediction increments of differing lengths may be used. Also, the above process is described in terms of performing an evaluation at pulse count milestones, that is, at a predetermined number of pulse counts. There may be instances, however, in which it is desired to perform an evaluation at times or pulse counts other than the predetermined times or pulse counts. Thus, the first step in such a process may be performing an evaluation "on demand," that is, when desired rather than waiting for a particular time, event, or pulse count.

Also, in the example above, only one binary determination is made. For some implementations it may be advantageous, however, to have the capability of making at least one additional binary prediction. This is another advantage of predicting outcomes in a binary form. Different predictions can be made at a single evaluation pulse count, e.g., given that a module has survived to 22.0 Bp, a first binary prediction would be whether it will it survive to 25.0 Bp. A second binary prediction would be whether it will survive to 23.0 Bp. A model yielding a binary outcome can be tuned to make both of those predictions. An approach in which the model predicts one of many values in a continuum such as predicting RUL would only enable one prediction.

Figure 4:
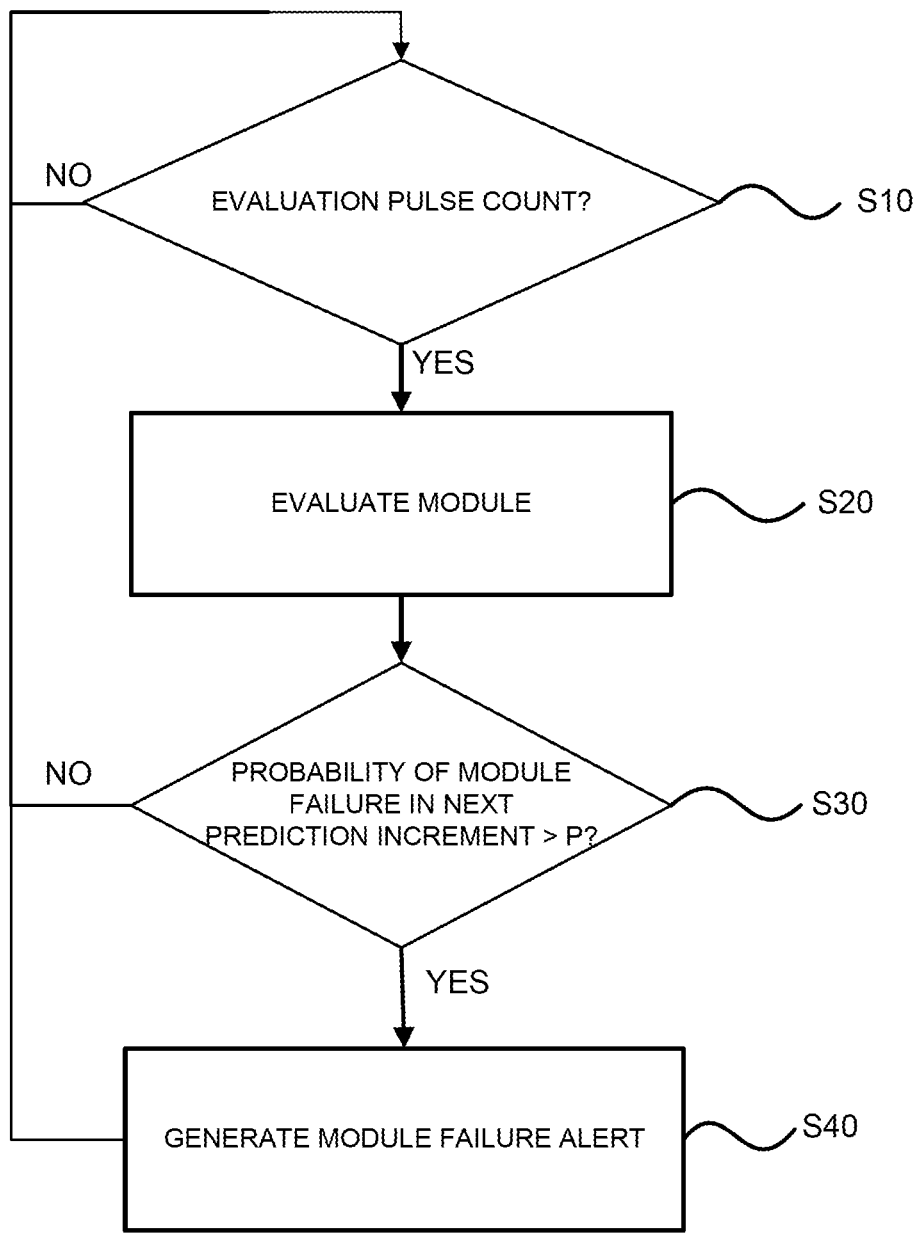
FIG. 4 is a flowchart illustrating a maintenance procedure according to an aspect of an embodiment.

FIG. 4 illustrates the process using a flowchart. In a step S10 it is determined whether the module is at an evaluation pulse count based on the number of pulses it participated in generating. In a step S20 the module is evaluated as described herein. This evaluation results in a determination in a step S30 about whether the probability of the module failing in a next prediction increment is greater than a certain threshold probability P. If the probability is greater than the threshold then a module failure alert is generated in a step S40. This step may be followed by a step of replacing the module in response to the module failure alert. If the probability of module failure in the next prediction increment is not greater than the threshold probability P then the process reverts to waiting for the next evaluation point.

In an aspect, one feature of a predictive model of module failure according to an embodiment is as a binary classification model. Each data instance in the binary classification model represents the evaluation of a module at a specific pulse count. At each evaluation, the objective of the model is to predict, yes or no, if the module will likely survive another prediction increment or likely fail before the end of the prediction increment.

The selection of the magnitude of the threshold probability or probability limit P is a design choice. The probability-limit P separates predictions of yes/no. The machine learning model will generate a "probability of belonging to the positive class" and the probability-limit separates the classes. The probability limit may, for example, be 50%. It could also, however, be another value such as 90%. The probability limit can be tuned to obtain the best modeling performance, that is, it can be varied to achieve the best alignment of the model predictions with historical data.

The above method offers several advantages. For example, the model returns a binary outcome (true or false) as compared to a continuous outcome (e.g., if the model attempted to predict the remaining useful life in a number of pulses—a continuous variable). This is significant because accuracy of data models to predict binary outcomes can generally be more accurate than data models to predict continuous outcomes.

The evaluation step may be carried out, for example, using an analytical model-based approach in which the analytical model is based on a physical understanding of the module, relying on the analytical model to represent the behavior of the system. According to an aspect of an embodiment, a data-driven approach, also known as a machine learning approach, is employed. This approach uses historical data to learn a model of system behavior. Machine learning or ML can be defined as a technology by which outcomes can be forecast based on a model prepared and trained on past or historical input data.

Such learned models are derived from machine learning algorithms such as Neural Networks, Decision Trees or Regression Analysis to generate conclusions. For instance, SVM is a supervised learning method that can be used for classification and regression analysis. It generally involves a training phase that requires machine condition (health) indicators with the corresponding label or equipment condition such as good, bad, fault.

Figure 5:
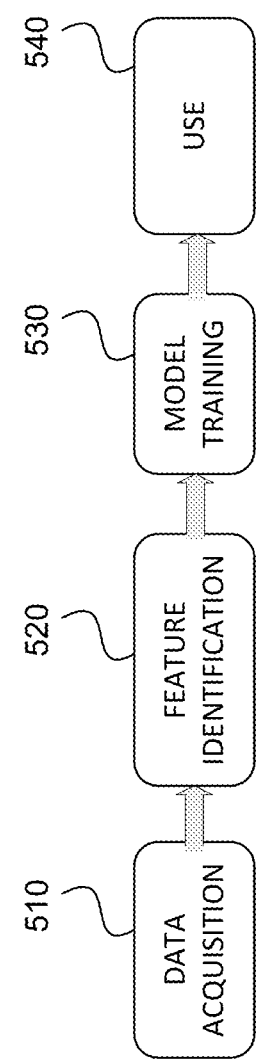
FIG. 5 is a diagram illustrating a procedure for creating, training, and using a model to be used for maintenance according to an aspect of an embodiment.

FIG. 5 is a block diagram showing aspects of model building in the context of modules for light sources. Block 510 is data acquisition. Over time, many instances of the same module have been installed and subsequently deinstalled in light sources deployed at global semiconductor fabs, and data collected during the lifetime of individual modules have been centrally stored. These historical data for deinstalled modules can be used to develop a model that can provide advance notice of module failure for modules that are currently installed.

Also, according to an aspect the model will use many instances for every module in the population of deinstalled modules. For a strategy that evaluates modules starting at 10 billion pulses to end of life in 0.1 billion pulse increments, for example, a module that fails at 32.55 billion pulses will contribute 226 instances to the model. Accordingly, a population of a few hundred modules can create a training dataset with tens of thousands of instances, which is favorable from a machine learning point of view in the sense that any of many different machine learning models may be used for implementation. It is also favorable because of enhanced accuracy for a larger training dataset.

The raw data may be preprocessed to bring it into a form from which condition indicators can be extracted.

Block 520 is feature identification or extraction. This is the identification of features (or metrics) whose behavior changes in a predictable way as the component ages and degrades.

In block 530 the identified features are used to train machine learning (ML) models to provide the binary prediction increment estimate. ML forecasts outcomes based on a model prepared and trained on past or historical input data and its output behavior. Here, the training involves aligning estimates with real-world data as described below.

As a specific example, in the following the master oscillator chamber is used as an example of a module, but it will be appreciated by one of ordinary skill in the art that this is only one example of a module to which the teachings herein may be applied, and that the teachings can equally well be applied to other modules. Other examples include the PA chamber, LNM, LAM, BAM, and OpuS modules and, in general, any module for which data are collected and related to performance of the module. There is a certain population of these modules that have been deinstalled as part of carrying out umbrella maintenance. A subset of these modules will have failed. The complementary subset of these modules will have been deinstalled not because they have failed (they will not have failed) but because they are replaced when another module is replaced.

Each of these deinstalled modules has associated with it an array of stored historical data in the form of metrics collected at various pulse counts. These metrics may be extracted and used by the prediction logic for all modules on a grid of pulse counts (e.g., 10 Bp to end of life in 0.1 Bp increments). Then, the model is trained by evaluating how well its predictions align with actual historical field outcomes. Ideally, the model should predict failure should predict failure within the prediction increment and should not predict failure within the prediction increment otherwise.

For example, each of approximately 1000 deinstalled modules may have been first evaluated at 10 Bp and then in 0.1 Bp increments to the pulse count at deinstall. Assuming an average deinstall pulse count of about 30 Bp, this means each module will on average have contributed about 200 evaluations ((30 Bp-10 Bp)/0.1) and the entire group of deinstalled modules will yield 200,000 evaluations.

There will be a group of measured metrics collected at each evaluation. Each of these metrics is extracted for all evaluation pulse counts. There are several different metrics which could be extracted and used as features. For example, if the module is an MO chamber module, the metrics could include:

(1) the number of MO-related energy batch quality ("BQ") events in the previous 100 Mp at 10 Bp, 10.1 Bp, 10.2 Bp, . . . for all modules;
(2) the number of detections of very low energy causing a system shutdown in previous week;
(3) average MO energy and voltage in previous 100 Mp.

The metrics could also include additional parameters such as laser attributes including model, region where deployed, account associated with the module, customer type, power-level employed, temperature and blower speed, bandwidth and wavelength stability, bearing hours, neon reduction settings and faults, efficiency metrics, and so on. The above would be captured in varying lookback windows or as a rate, e.g., mean wavelength sigma in previous 1 Bp and previous 5 Bp, or in previous 1 Bp with respect to the first 5 Bp of life.

The metrics could also include consistent feature sets such as a count of individual fault signatures in the previous 100 Mp, 1 Bp, and 2 B or data derived from individual sensors such as voltage and MO energy.

Assuming at least 4 metrics for each of the 200,000 evaluations results in approximately 800,000 total metrics.

These metrics will be supplied to the model. Then, in training, the model will make predictions, compare the predictions to field outcomes, and then tune its application of the metrics and compare again, converging on prediction logic that aligns with the field outcomes.

For example, the prediction logic could be executed to derive approximately 200,000 predictions. Then these 200,000 predictions can be compared to a prediction objective, e.g., predict failure within 1 Bp or less with respect to the deinstall pulse count for modules that actually failed, and do not predict failure otherwise.

According to an aspect of an embodiment, the system is designed to predict binary module failure in a prediction increment, e.g., to predict module failure within a prediction increment prior to deinstall for failure while never predicting module failure prior to module deinstall for modules causing no technical issues. The system can work for any module and is designed and tested using historical data.

Figure 6:
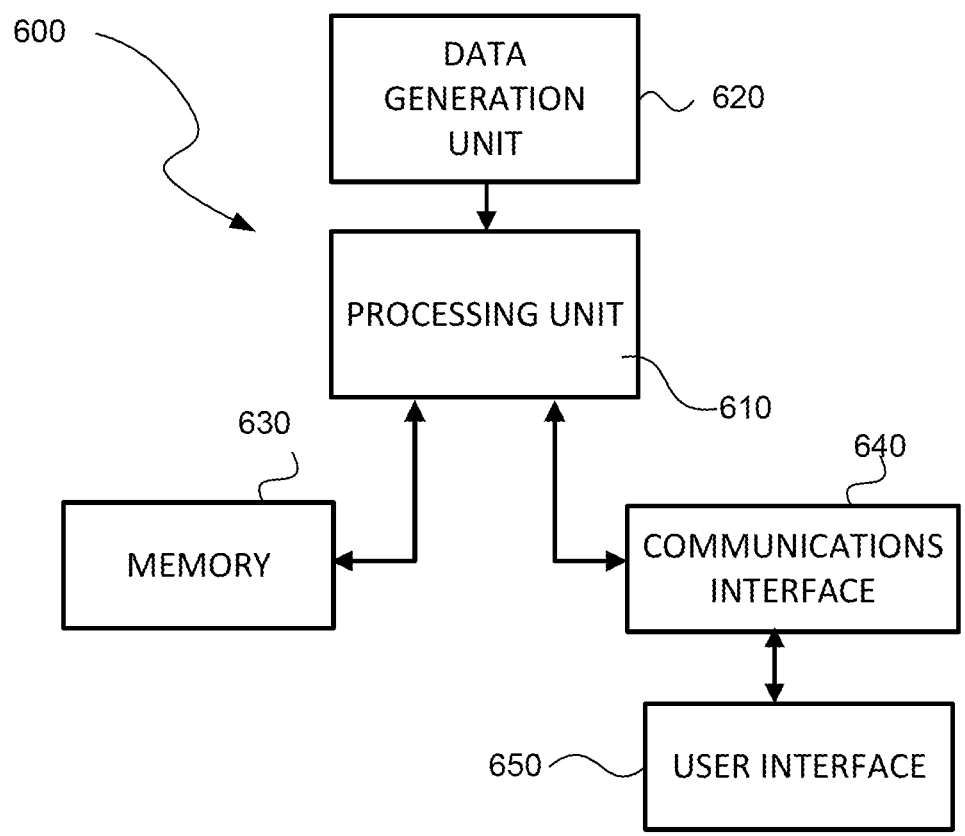
FIG. 6 is a functional block diagram of a maintenance system according to an aspect of an embodiment.

The operations described can be carried out with a control system 600 as shown in FIG. 6. The control system 600 includes a processing unit 610 is connected to a data generation unit 620, a memory 630, and a communications interface 640 which is in turn connected to a user interface 650. This control system 600 may be the same as, in addition to, or share components with the control system 135 of FIG. 1.

The data generation unit 620 can include sensors arranged to measure various metrics. For example, if the module in question is an MO chamber module, the sensors could include sensors for measuring a voltage across the electrodes in the module, energy, gas pressure, temperature, pulse wavelength, and the like. The data generation unit 620 may also include counters for measuring total pulses and repetition rate. The data generation module 620 may include a clock for measuring total runtime. Of course, these are just examples, it will be apparent that other or additional data can be gathered. The data generation unit 620 can include means for input of data either manually or electronic data transfer.

The processing unit 610 may store these data in a data storage module. These data can then be accessed directly using a hardwired user interface or wirelessly, locally, or remotely, through the communications interface 640. For example, the communications interface 640 could include a Wi-Fi interface, a cellular telephony interface such as a CDMA interface, a Bluetooth interface, a radio interface, a USB interface, and/or a near field communication interface. Of course, these are just examples, and it will be apparent that other or additional communication modules may be used such as an RFID interface. The communications interface 640 may essentially be any device for communicating data to or from the processing unit 610 and one or more user interface devices.

The user interface 650 may include any device by which a user can provide information to or receive information from each other or the system hardware and software. Thus, the user interface 650 may include a keypad, a barcode reader, a mobile device such as a smart phone having an appropriate application, a generic computer interface, a hardwired connection, and a display. Of course, these are just examples; it will be apparent that other or additional user interface devices may be used. The user interface may include various controls including, for example, a touchscreen and an array of indicators. It may include a digital display.

As mentioned, the user interface 650 can also be implemented as software operating on a computer or as an application on a smart phone or tablet or other wireless communication device. In such circumstances, the communications interface 640 could be configured to interface with an external device such as a wireless enabled device such as a computer, tablet, or cell phone. The user could use an application on the mobile device to control operation of the maintenance data gathering system. If the external device is a wireless enabled device such as a computer, tablet, or cell phone, an application could be installed on the external device and the user interface for the application could, for example, be a visual representation of a display with controls.

According to an aspect, embodiments of the invention provide advance notice of probable module failure in a prediction increment. This notice enables field teams to prepare for maintenance events, and thereby to avoid unscheduled events caused by failures before an umbrella service increment. Fab productivity is increased by reducing prolonged down events associated with unscheduled maintenance. The same capability can be useful for prioritizing multiple maintenance events in order of probability of failure in a prediction increment.

Figure 7:
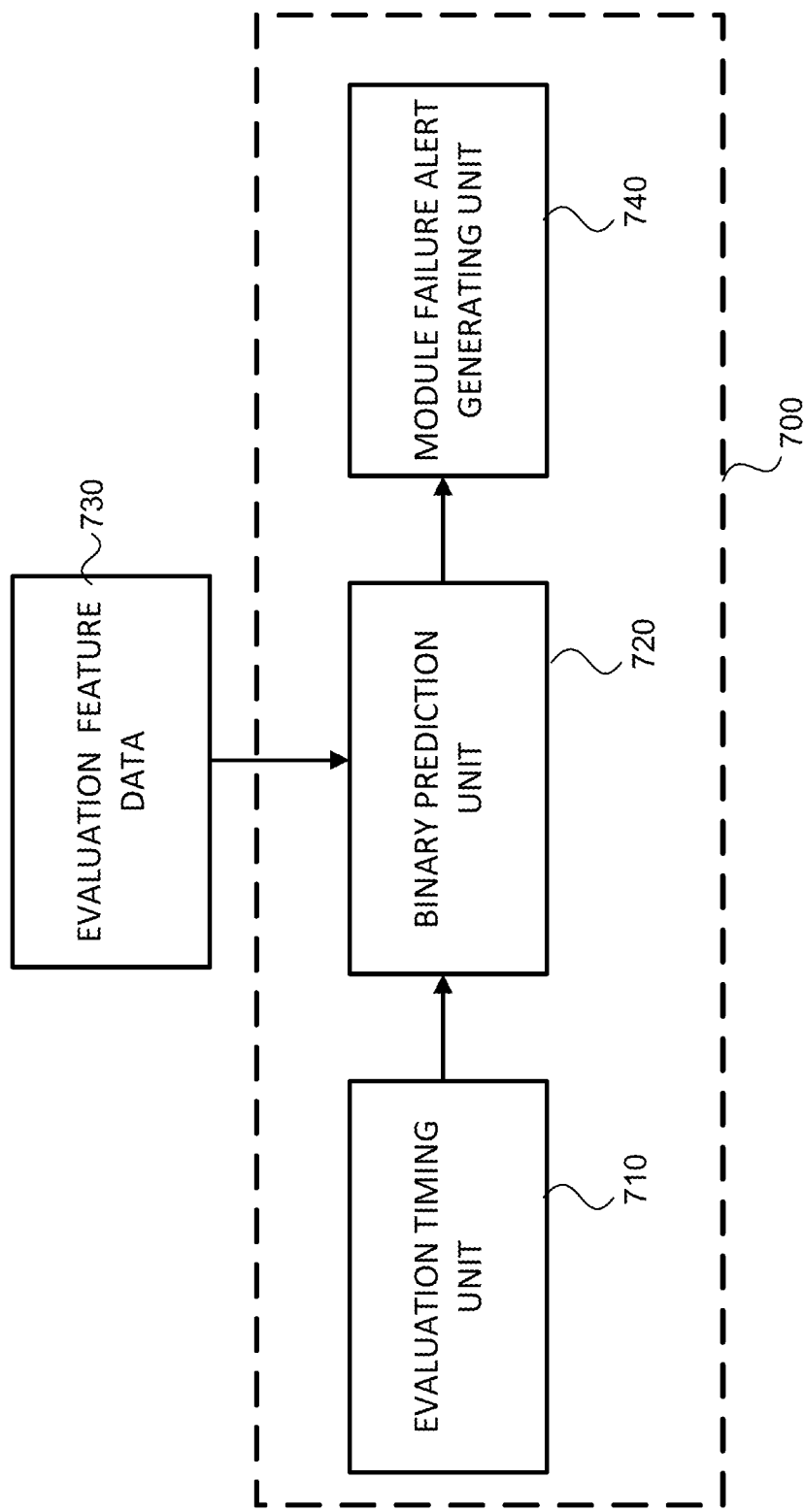
FIG. 7 is a functional block diagram of a maintenance system according to another aspect of an embodiment.

FIG. 7 is a functional block diagram of a maintenance system 700 according to aspects of an embodiment. The maintenance system 700 includes an evaluation timing unit 710 which determines whether an evaluation point for a module has been reached. This determination can, for example, be on the basis of pulse count. If the evaluation timing unit 710 determines that an evaluation time for has been reached, then the evaluation timing unit 710 prompts a binary prediction unit 720 to render a binary determination of whether the module being evaluated is likely to operate satisfactorily over the entirety of an ensuing number of pulses making up a prediction increment. The binary prediction unit 720 may include a model of the module learned through training on a feature set. The binary prediction unit 720 uses a set of features which may be supplied by a source of evaluation feature data 730 as inputs to the model to produce the binary determination. If the binary determination is that the module being evaluated is not likely to operate satisfactorily over the entirety the prediction increment, then the binary prediction unit 720 prompts a module failure alert generating unit 740 to generate a failure alert. Alternatively and equivalently, the binary prediction unit 720 supplies the binary determination to the module failure alert generating unit 740 and the module failure alert generating unit 740 generates a failure alert if the binary determination is that the module being evaluated is not likely to operate satisfactorily over the entirety the prediction increment. The module failure alert generating unit 740 may also be configured to generate a positive "no fault" indication if the module being evaluated is likely to operate satisfactorily over the entire prediction increment.

According to another aspect of an embodiment, multiple models are trained each according to a different relative prioritization of certain maintenance parameters such as tool availability versus avoiding a risk that the tool may fail unexpectedly, as explained below. Differentiation between customers or sectors can increase the usefulness of these interfaces and reports for one customer or sector, e.g., DRAM memory customers as opposed to another class of customers, e.g., foundry customers. Similarly, such differentiation can improve usefulness of the interfaces and reports for tight-tolerance current generation tools as opposed to legacy technology tools.

One advantage of machine learning models is that they can be selected and/or tuned so that the model provides predictions and recommendations which are best suited to the meeting a particular customer's preferences and needs as determined by the customer. For example, one customer may determine that, given the particular conditions of its technical and supply environment, it wishes to prioritize tool availability over avoiding a risk that the tool may fail unexpectedly. Another customer may reach the opposite conclusion, i.e., it may wish to avoid unexpected downtime at the cost of accepting some additional lack of tool availability. The first customer will want to maximize their wafer output while taking on higher risk. The second customer will want to receive early indications of module failure at the expense of availability. This may translate to an assessment of the relative importance of sensitivity (accuracy of true positives), specificity (accuracy of true negatives), and cost metric in the form of lost pulses. The term "lost pulses" is used here to refer to the number of pulses that would have been lost if the module had been de-installed at a first failure prediction. Using this metric, the predictive model has a way to quantify false predictions and thereby be trained to avoid false predictions that are too early. Assigning these relative priorities may entail tradeoffs. In some implementations it may be advantageous to permit customers to weigh these tradeoffs and optimize the models for their specific use cases.

For example, customers could be given the option of maintenance under a "Maximum Output" model that seeks to achieve increased availability with the assumption of more risk of missing failure indicators. These customers can prioritize several targets including external time-based output targets for financial reporting, internal production targets, or high pricing windows. Alternatively, customers can be given the option of maintenance under an "Early Warning" model to target advanced planning for their tool sets. the "Early Warning" model may be defined as one which achieves reduced risk of unscheduled maintenance with the possibility of lost availability. This provides value through information that enables optimal fab routing and scheduling.

As a specific example, in a modern fab, when a lithocell (generally regarded as the combination of the laser, scanner, and tracker) is down for maintenance, all product that was planned for that lithocell must be re-routed until the lithocell is recovered. In the case of leading-edge immersion tools, customers can choose to use a single tool for multiple wafer passes to benefit from the tighter dedicated chuck overlay specifications from scanner manufacturers. With improved knowledge of when a failure may occur, fab operational management can better optimize the entire fab capacity and ensure high yields. Furthermore, lithocell systems can have extended qualification times (days) that compound the planning challenges and increase the value of managing fab uptime, i.e., green-to-green time.

Thus, customers may find it advantageous to be able to select from among different models based on various maintenance objectives, some of which may be competing, such as maximizing output and early warning.

Figure 8:
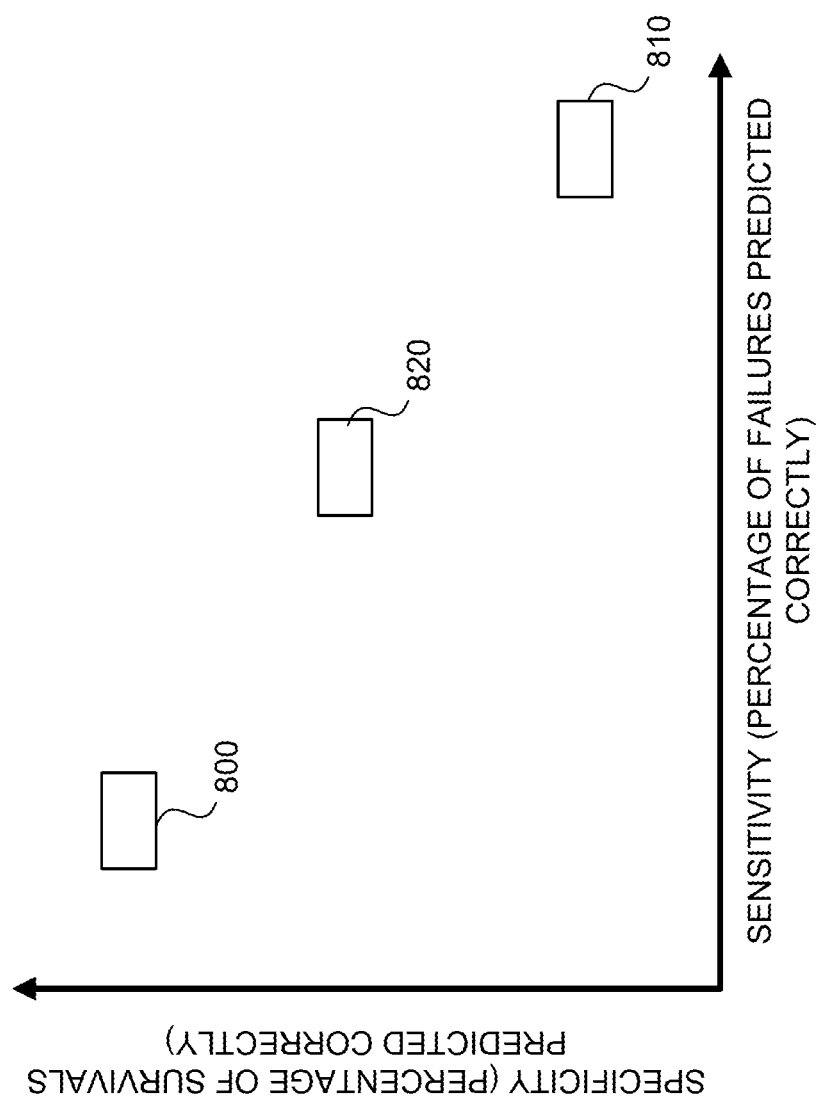
FIG. 8 is a graph showing various possible combinations of prioritizations according to an aspect of an embodiment.

For example, one tradeoff may be sensitivity versus specificity. This is shown graphically in FIG. 8. The x-axis is the percentage of failures predicted correctly, that is, specificity or the accuracy of true positives. The y-axis is the percentage of survivals predicted correctly, in other words, the y-axis shows sensitivity, that is, the accuracy of true negatives. The region indicated by the box 800 would be selected by a customer choosing to pursue an "Maximum Output" strategy optimized on the low risk of extension, i.e., prioritizing correctly predicting survival over predicting failures. The priority for a customer adopting this strategy would be the priority of true negatives and continued availability. On the other hand, a customer choosing a combination of specificity and sensitivity indicated in the region marked by the box 810 would be adopting an "Early Warning" strategy. The priority for this customer would be the number of true positives and avoiding unscheduled downtime. Box 820 indicates a region in the sensitivity/selectivity space representing a balanced approach with equal weight given to sensitivity and specificity.

As an example, one can assume a model definition where evaluations are made every 0.1 Bp with a 2 Bp prediction increment. If the module were otherwise destined to be deinstalled at 24.8 Bp for failure, an ideal case would predict failure at 22.8 Bp. An early warning model which ensures that the possibility of failure is detected before the actual failure, would indicate false positives at some point at or before 22.8 Bp. A maximum output model which is less conservative and allows maximum output would indicate true positives after 22.8 Bp.

The selection of the model is based at least in part on information indicating a user's maintenance goals or preferences. Simultaneous satisfaction of these preferences may or may not involve trade-offs. For example, as mentioned, one maintenance preference may be output maximization which may be met by limiting the amount of time used in taking equipment offline and evaluating it, for example, by reducing the frequency of evaluations. Another preference may be avoidance of unforeseen downtime which may be met by more frequent and/or lengthier evaluations. The model may be selected on the basis of information indicating the relative importance or prioritization the user assigns these two preferences. Other preferences may include overall reduction of running costs, overall equipment lifetime, and so forth, and, in general, any consideration that would affect how maintenance operations are carried out. All of these are intended to be subsumed in the term "maintenance preference."

Thus, there are a variety of models which differ from each other as to how they are trained, specifically as to the prioritization of certain maintenance objectives or parameters.

Figure 9:
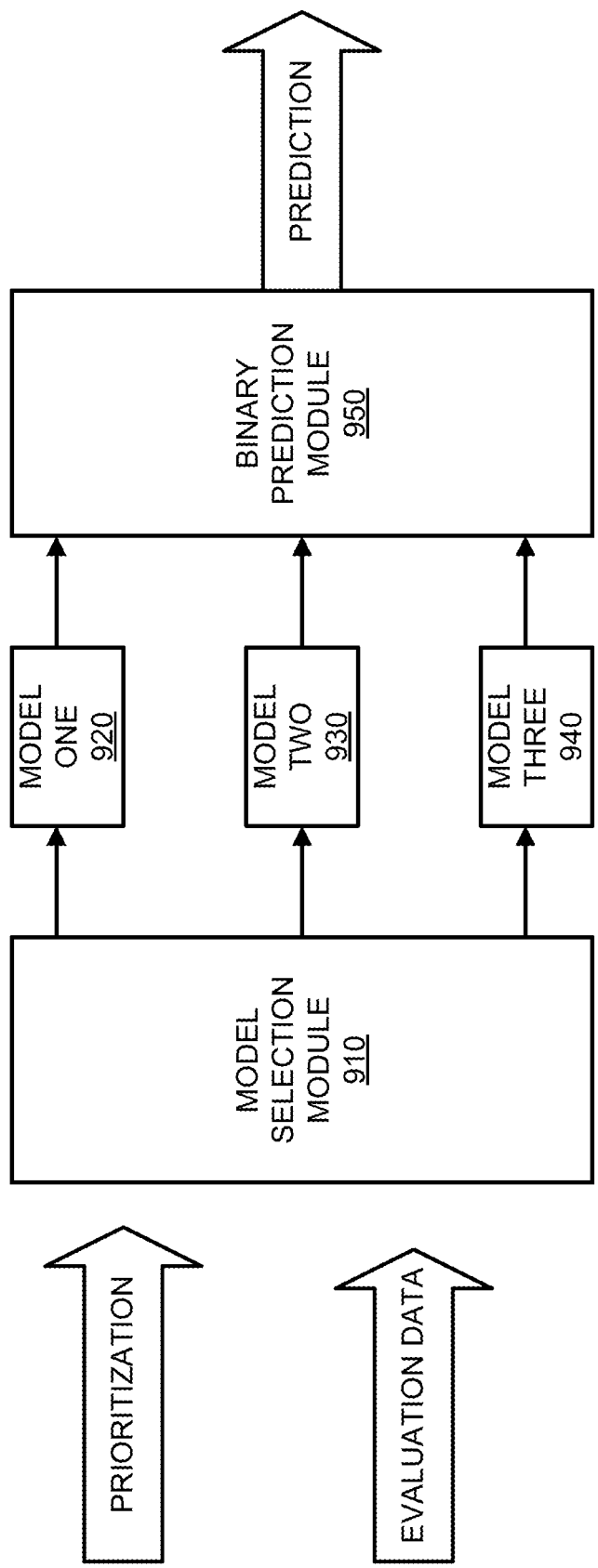
FIG. 9 is a functional block diagram showing a possible arrangement for a maintenance system according to an aspect of an embodiment.

A functional block diagram conceptually depicting operation of a system permitting customers to select prioritizations is shown in FIG. 9. In FIG. 9, a model selection module 910 receives evaluation data acquired during an evaluation event and also receives prioritization data which indicates for a particular customer how that customer wishes to assign relative priorities for, for example, sensitivity and selectivity. This prioritization data may also be simply a customer choosing a particular model from a menu of candidate models. The model selection module 910 determines which model of a set of differently trained models, e.g., Model One (designated by numeral 920), Model Two (designated by numeral 930), and Model Three (designated by numeral 940) was selected by the customer or which best aligns with the prioritization specified by the customer. As an example, Model One could be a maximum output model, Model Two could be a balanced model, and Model Three could be an early warning model as described above. While the arrangement in FIG. 9 shows three candidate models, it will be obvious to one of ordinary skill in the art that the number of models could be 2, 3, or greater. The selected model operates on the evaluation data and supplies the outcome of the operation to the binary prediction model 950 which renders a binary prediction on whether, according to the customer's prioritization, an event such as a deinstall should occur before the next evaluation.

The arrangement of FIG. 9 shows just one example of how the system can be conceptually divided into separate modules. It will be apparent that the functionality can be divided conceptually in different manners. For example, the models could render the predictions directly. Also, the prioritization data could be a direct selection of one of the three models with the models then directly receiving the evaluation data.

Figure 10:
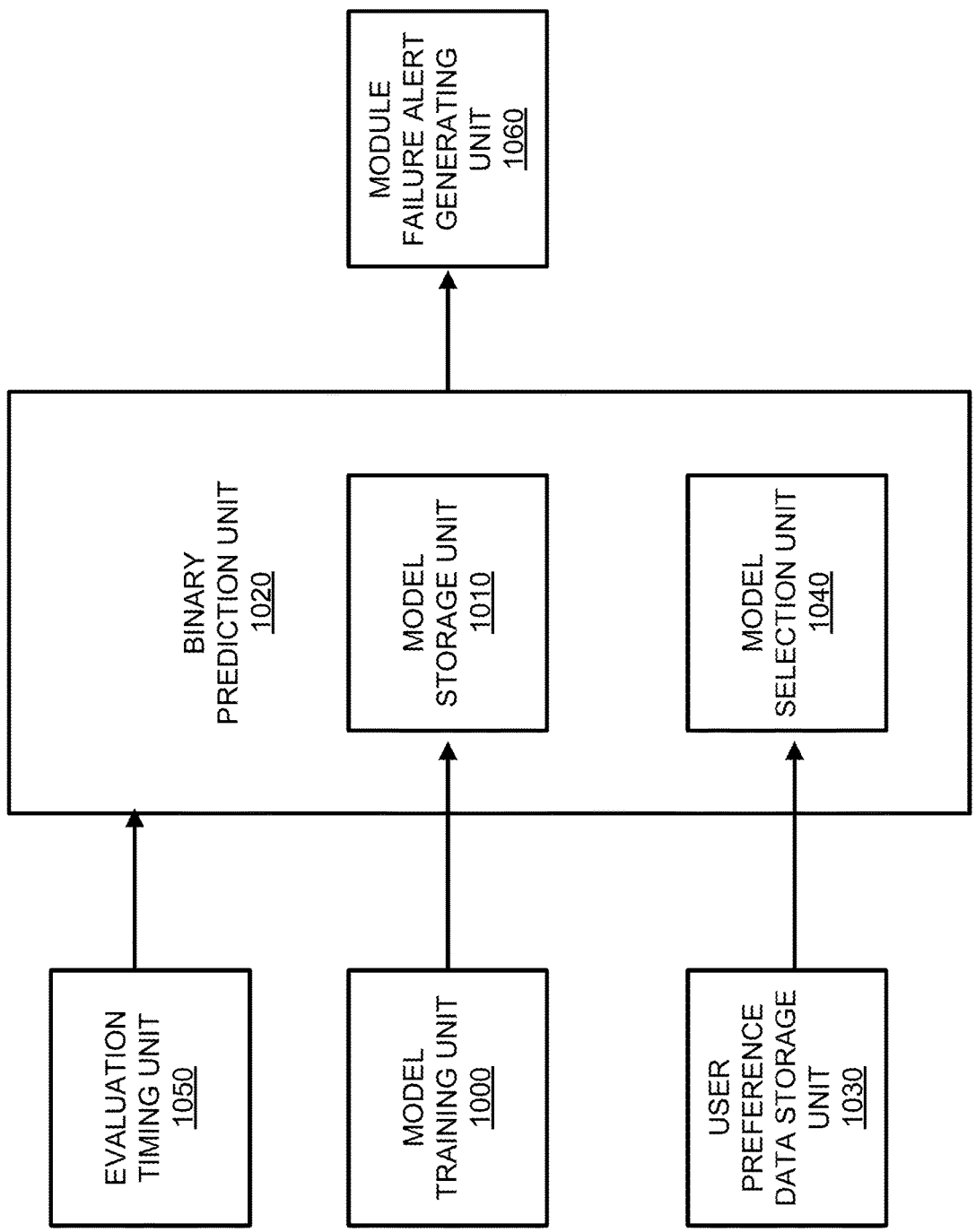
FIG. 10 is a functional block diagram showing a possible arrangement for a maintenance system according to an aspect of an embodiment.

For example, FIG. 10 is a functional block diagram of an arrangement according to another aspect of an embodiment. In FIG. 10, a model training unit 1000 trains multiple models using different weighting for various maintenance objectives. The models are stored in a model storage unit 1010 in a binary prediction unit 1020. Also, user preference data storage unit 1030 includes information on a user's relative preference for maintenance objectives or even an explicit customer selection of a model and supplies that information to a model selection unit 1040 also in the binary prediction unit 1020. Thus, when the evaluation timing unit 1050 determines that the time has come for an evaluation based on the passage of chronological time or time or machine time based on number of pulses, the binary prediction unit 1020 operates on evaluation data using the selected model and generates signal for a model module failure alert generating unit 1060 which will generate a module failure alert. The binary prediction unit 1020 can also generate an affirmative signal that no maintenance action need be taken.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. The embodiments can be further described using the following clauses:

1. A method of maintaining a light source for semiconductor photolithography, the light source comprising one or more modules, the method comprising:
determining whether a module which is one of the one or more modules is due for an initial evaluation based at least in part on a first number of pulses the module has participated in generating; performing the initial evaluation to determine whether the module has at least a minimum probability of operating without a failure in a prediction increment measured as a second number of pulses; and generating a module failure alert for the module if the initial evaluation determines that the module does not have at least the minimum probability of operating without a failure in the prediction increment.

2. The method as in clause 1 further comprising leaving the module in service if the initial evaluation determines that the module has at least the minimum probability of operating without a failure in the prediction increment.

3. The method as in clause 1 wherein determining whether a module which is one of the one or more modules is due for an initial evaluation based at least in part on a first number of pulses the module has participated in generating comprises evaluating whether the first number corresponds to a pulse milestone of a predetermined number of pulses.

4. The method as in clause 3 wherein generating a module failure alert for the module if the initial evaluation determines that the module does not have at least the minimum probability of operating without a failure in the prediction increment comprises using a model to render a binary (true/false) prediction of whether the module is likely to operate without failure during the prediction increment.

5. The method as in clause 1 further comprising performing a maintenance operation on the module if the initial evaluation determines that the module does not have at least the minimum probability of operating without a failure in the prediction increment.

6. The method as in clause 5 wherein performing the maintenance operation comprises deinstalling the module.

7. The method as in clause 5 wherein performing the maintenance operation comprises repairing the module.

8. The method as in clause 1 wherein the first number is about ten billion pulses.

9. The method as in clause 1 wherein the second number is about two billion pulses.

10. The method as in clause 1 wherein the second number is determined based at least in part on an age of the module in terms of chronological age or cumulative pulse count.

11. The method as in clause 1 further comprising steps after leaving the module in service of determining whether the module is due for an additional evaluation based at least in part based on a third number of pulses the module has participated in generating since the initial evaluation;
performing the additional evaluation to determine whether the module has at least a minimum probability of operating without a failure in a second prediction increment measured as a fourth number of pulses; and either
generating a module failure alert for the module if the additional evaluation determines that the module does not have at least the minimum probability of operating without a failure in the second prediction increment or
leaving the module in service if the additional evaluation determines that the module has at least the minimum probability of operating without a failure in the second prediction increment.

12. The method as in clause 11 further comprising deinstalling the module if the additional evaluation determines that the module does not have at least the minimum probability of operating without a failure in the second prediction increment.

13. The method as in clause 11 wherein the third number is about 0.1 billion pulses.

14. The method as in clause 11 wherein the fourth number is about two billion pulses.

15. The method as in clause 1 wherein at least one of the third number and the fourth number is determined based at least in part on an age of the module in terms of chronological age or cumulative pulse count.

16. The method as in clause 1 wherein performing the initial evaluation comprises using a model.

17. The method as in clause 16 wherein the model is an analytical model.

18. The method as in clause 16 wherein the model is a trained model developed through machine learning by supplying feature data to train the trained model and wherein the trained model makes the initial determination based on at least some of the feature data.

19. The method as in clause 18 wherein the module comprises a master oscillator chamber module and wherein the feature data includes a number of master oscillator-related energy batch quality events in an immediately previous 100 million pulses.

20. The method as in clause 18 wherein the module comprises a master oscillator chamber module and wherein the feature data includes average master oscillator energy in an immediately previous 100 million pulses.

21. A computer-implemented method comprising:
determining, by a computing device, whether a module which is one of one or more modules of a photolithography light source, is due for an initial evaluation based at least in part on a first number of pulses the module has participated in generating;
performing, by the computing device, the initial evaluation to determine whether the module has at least a minimum probability of operating without a failure in a prediction increment measured as a second number of pulses; and either providing, by the computing device, an indication that the module should be deinstalled if the initial evaluation determines that the module does not have at least the minimum probability of operating without a failure in the prediction increment or providing, by the computing device, an indication that the module should be left in service if the initial evaluation determines that the module has at least the minimum probability of operating without a failure in the prediction increment.

22. A non-transitory computer-readable storage medium comprising executable instructions to cause a processor to perform operations, the instructions comprising instructions to:

determine whether a module which is one of one or more modules of a photolithography light source is due for an initial evaluation based at least in part based on a first number of pulses the module has participated in generating;

perform the initial evaluation to determine whether the module has at least a minimum probability of operating without a failure in a prediction increment measured as a second number of pulses; and either provide an indication that the module should be deinstalled if the initial evaluation determines that the module does not have at least the minimum probability of operating without a failure in the prediction increment or provide an indication that the module should be left in service if the initial evaluation determines that the module has at least the minimum probability of operating without a failure in the prediction increment.

23. A method of maintaining a light source for semiconductor photolithography, the light source comprising one or more modules, the method comprising:

identifying for evaluation a module which is one of the one or more modules;

performing an evaluation to determine whether the module has at least a minimum probability of operating without a failure in a prediction increment measured as a second number of pulses; and generating a module failure alert for the module if the initial evaluation determines that the module does not have at least the minimum probability of operating without a failure in the prediction increment or leaving the module in service if the initial evaluation determines that the module has at least the minimum probability of operating without a failure in the prediction increment.

24. The method as in clause 23 further comprising deinstalling the module if the initial evaluation determines that the module does not have at least the minimum probability of operating without a failure in the prediction increment.

25. The method as in clause 23 wherein the first number is about ten billion pulses.

26. The method as in clause 23 wherein the second number is about two billion pulses.

27. The method as in clause 23 wherein performing the evaluation comprises using a trained model developed through machine learning by supplying feature data to train the trained model and wherein the trained model determines whether the module has at least a minimum probability of operating without a failure in a prediction increment measured as a second number of pulses based on at least some of the feature data.

28. A system for maintaining a light source for semiconductor photolithography, the light source comprising one or more modules, the system comprising:

an evaluation timing unit adapted to determine whether a module which is one of the one or more modules is due for an evaluation based at least in part on a first number of pulses the module has participated in generating;

a binary prediction unit arranged to be responsive to the evaluation timing unit and adapted to perform the evaluation by determining whether the module has at least a minimum probability of operating without a failure in a prediction increment measured as a second number of pulses; and a module failure alert generating unit arranged to be responsive to the binary prediction unit and adapted to generate a module failure alert for the module if the evaluation determines that the module does not have at least the minimum probability of operating without a failure in the prediction increment.

29. The system as in clause 28 wherein the module failure alert generating unit is additionally configured to generate a positive no fault indication if the module being evaluated is likely to operate satisfactorily over the entire prediction increment.

30. The system as in clause 28 wherein the binary prediction unit comprises a model generated by machine learning from a feature set.

31. The system as in clause 28 wherein the binary prediction unit is arranged to receive feature data and uses the feature data to determine whether the module has at least a minimum probability of operating without a failure in the prediction increment.

32. A system for maintaining a light source for semiconductor photolithography, the light source comprising one or more modules, the system comprising:

an evaluation timing unit adapted to generate an evaluation signal when a module which is one of the one or more modules has reached an evaluation point on the basis of a pulse count;

a binary prediction unit arranged to receive the evaluation signal and adapted to render in response to the evaluation signal a binary determination of whether the module being evaluated is likely to operate satisfactorily over the entirety of an ensuing number of pulses making up a prediction increment; and a module failure alert generating unit arranged responsively to the binary prediction unit and adapted to generate a failure alert if the binary determination is that the module being evaluated is not likely to operate satisfactorily over the entirety the prediction increment.

33. The system as in clause 32 wherein the binary prediction unit comprises a model generated by machine learning from a feature set.

34. The system as in clause 32 wherein the binary prediction unit is arranged to receive feature data and uses the feature data to determine whether the module has at least a minimum probability of operating without a failure in the prediction increment.

35. A method of maintaining a light source for semiconductor photolithography, the light source comprising one or more modules, the method comprising:

acquiring user information indicative of a user's relative prioritization of two or more maintenance preferences;

training at least two models including a first model based on a first relative prioritization of the two or more maintenance preferences and a second model based on a second relative prioritization of the two or more maintenance preferences;

performing an evaluation to determine whether a module failure alert should be generated, the evaluation being performed using one of the at least two models based on which model relative prioritization most closely aligns with the user's relative prioritization; and generating a module failure alert for the module if the evaluation determines that a module failure alert should be generated.

36. The method as in clause 35 wherein performing an evaluation using one of the at least two models based on which model relative prioritization most closely aligns with the user's relative prioritization comprises performing an evaluation using the one of the at least two models selected by the user.

37. The method as in clause 35 wherein the maintenance preferences are output maximization and avoidance of unforeseen downtime.

38. The method as in clause 35 further comprising indicating that the module remain in service if the evaluation determines that a module failure alert should not be generated.

39. The method as in clause 35 further comprising determining whether the module is due for an evaluation based at least in part on a number of pulses the module has participated in generating.

40. The method as in clause 35 wherein performing an evaluation to determine whether a module failure alert should be generated comprises selecting a model from the at least two models based on the user's relative prioritization, to render a binary (true/false) determination on whether a module failure alert should be generated.

41. The method as in clause 35 further comprising performing a maintenance operation on the module if the evaluation determines that a module failure alert should be generated.

42. The method as in clause 41 wherein performing the maintenance operation comprises deinstalling the module.

43. The method as in clause 41 wherein performing the maintenance operation comprises repairing the module.

44. The method as in clause 35 wherein the models are trained models developed through machine learning by supplying feature data to train the trained models and wherein a selected one of the trained models makes the determination based on at least some of the feature data.

45. A computer-implemented method comprising:

storing, using a computing device, user information indicative of a user's relative prioritization of two or more maintenance preferences;

training, using a computing device, at least two models including a first model based on a first relative prioritization of the two or more maintenance preferences and a second model based on a second relative prioritization of the two or more maintenance preferences;

selecting, using a computing device, one of the models as a selected model based on the user information;

performing, using the selected model on a computing device by, an evaluation to determine whether a module failure alert should be generated; and either providing, by the computing device, an indication that the module should be deinstalled if the evaluation determines that the a module failure alert should be generated or providing, by the computing device, an indication that the module should be left in service if the evaluation determines that a module failure alert should not be generated.

46. The computer-implemented method as in clause 45 wherein the maintenance preferences are output maximization and avoidance of unforeseen downtime.

47. A non-transitory computer-readable storage medium comprising executable instructions to cause a processor to perform operations, the instructions comprising instructions to:

store user information indicative of a user's relative prioritization of two or more maintenance preferences;

train at least two models including a first model based on a first relative prioritization of the two or more maintenance preferences and a second model based on a second relative prioritization of the two or more maintenance preferences;

select one of the models as a selected model based on the user information;

perform using the selected model an evaluation to determine whether a module failure alert should be generated; and either provide an indication that the module should undergo a maintenance procedure if the evaluation determines that the a module failure alert should be generated or provide an indication that the module should be left in service if the evaluation determines that a module failure alert should not be generated.

48. The non-transitory computer-readable storage medium as in clause 47 wherein the maintenance preferences are output maximization and avoidance of unforeseen downtime.

49. A system for maintaining a light source for semiconductor photolithography, the light source comprising one or more modules, the system comprising:

a user preference data storage unit adapted to store user preference data on user relative prioritizations of two or more maintenance preferences;

an evaluation timing unit adapted to determine whether a module which is one of the one or more modules is due for an evaluation based at least in part on a first number of pulses the module has participated in generating;

a model training unit adapted to train a first model based on a first relative prioritization of the two or more maintenance preferences and a second model based on a second relative prioritization of the two or more maintenance preferences;

a model selection unit adapted to select one of the models as a selected model based on the user preference data;

a binary prediction unit arranged to be responsive to the evaluation timing unit and the user preference input unit and adapted to perform the evaluation by determining using the selected model whether a module failure alert should be generated; and a module failure alert generating unit arranged to be responsive to the binary prediction unit and adapted to generate the module failure alert for the module if the evaluation determines that the a module failure alert should be generated.

50. The system as in clause 49 wherein the maintenance preferences are output maximization and avoidance of unforeseen downtime.

51. The system as in clause 49 wherein the module failure alert generating unit is additionally configured to generate a positive no fault indication if the binary prediction unit determines that a module failure alert should not be generated.

Other implementations are within the scope of the claims.

The invention claimed is:

1. A method of maintaining a light source for semiconductor photolithography, the light source comprising one or more modules, the method comprising:
  determining whether a module which is one of the one or more modules is due for an initial evaluation based at least in part on a first number of pulses the module has participated in generating;
  performing the initial evaluation to determine whether the module has at least a minimum probability of operating without a failure in a prediction increment measured as a second number of pulses; and
  generating a module failure alert for the module if the initial evaluation determines that the module does not have at least the minimum probability of operating without a failure in the prediction increment.

2. The method as in claim 1 further comprising leaving the module in service if the initial evaluation determines that the module has at least the minimum probability of operating without a failure in the prediction increment.

3. The method as in claim 1 wherein determining whether a module which is one of the one or more modules is due for an initial evaluation based at least in part on a first number of pulses the module has participated in generating comprises evaluating whether the first number corresponds to a pulse milestone of a predetermined number of pulses.

4. The method as in claim 3 wherein generating a module failure alert for the module if the initial evaluation determines that the module does not have at least the minimum probability of operating without a failure in the prediction increment comprises using a model to render a binary (true/false) prediction of whether the module is likely to operate without failure during the prediction increment.

5. The method as in claim 1 further comprising performing a maintenance operation on the module if the initial evaluation determines that the module does not have at least the minimum probability of operating without a failure in the prediction increment.

6. The method as in claim 1 wherein the second number is determined based at least in part on an age of the module in terms of chronological age or cumulative pulse count.

7. The method as in claim 1 further comprising steps after leaving the module in service of
  determining whether the module is due for an additional evaluation based at least in part based on a third number of pulses the module has participated in generating since the initial evaluation;
  performing the additional evaluation to determine whether the module has at least a minimum probability of operating without a failure in a second prediction increment measured as a fourth number of pulses; and either
  generating a module failure alert for the module if the additional evaluation determines that the module does not have at least the minimum probability of operating without a failure in the second prediction increment or
  leaving the module in service if the additional evaluation determines that the module has at least the minimum probability of operating without a failure in the second prediction increment.

8. The method as in claim 7 further comprising deinstalling the module if the additional evaluation determines that the module does not have at least the minimum probability of operating without a failure in the second prediction increment.

9. The method as in claim 1 wherein at least one of the third number and the fourth number is determined based at least in part on an age of the module in terms of chronological age or cumulative pulse count.

10. The method as in claim 1 wherein performing the initial evaluation comprises using a model.

11. The method as in claim 10 wherein the model is an analytical model.

12. The method as in claim 10 wherein the model is a trained model developed through machine learning by supplying feature data to train the trained model and wherein the trained model makes the initial determination based on at least some of the feature data.

13. A non-transitory computer-readable storage medium comprising executable instructions to cause a processor to perform operations, the instructions comprising instructions to:
  determine whether a module which is one of one or more modules of a photolithography light source is due for an initial evaluation based at least in part based on a first number of pulses the module has participated in generating;
  perform the initial evaluation to determine whether the module has at least a minimum probability of operating without a failure in a prediction increment measured as a second number of pulses; and either
  provide an indication that the module should be deinstalled if the initial evaluation determines that the module does not have at least the minimum probability of operating without a failure in the prediction increment or
  provide an indication that the module should be left in service if the initial evaluation determines that the module has at least the minimum probability of operating without a failure in the prediction increment.

14. A method of maintaining a light source for semiconductor photolithography, the light source comprising one or more modules, the method comprising:
  identifying for evaluation a module which is one of the one or more modules;
  performing an evaluation to determine whether the module has at least a minimum probability of operating without a failure in a prediction increment measured as a second number of pulses; and
  generating a module failure alert for the module if the initial evaluation determines that the module does not have at least the minimum probability of operating without a failure in the prediction increment or
  leaving the module in service if the initial evaluation determines that the module has at least the minimum probability of operating without a failure in the prediction increment.

15. The method as in claim 14 further comprising deinstalling the module if the initial evaluation determines that the module does not have at least the minimum probability of operating without a failure in the prediction increment.

16. The method as in claim 14 wherein performing the evaluation comprises using a trained model developed through machine learning by supplying feature data to train the trained model and wherein the trained model determines whether the module has at least a minimum probability of operating without a failure in a prediction increment measured as a second number of pulses based on at least some of the feature data.

17. A system for maintaining a light source for semiconductor photolithography, the light source comprising one or more modules, the system comprising:
an evaluation timing unit adapted to determine whether a module which is one of the one or more modules is due for an evaluation based at least in part on a first number of pulses the module has participated in generating; a binary prediction unit arranged to be responsive to the evaluation timing unit and adapted to perform the evaluation by determining whether the module has at least a minimum probability of operating without a failure in a prediction increment measured as a second number of pulses; and a module failure alert generating unit arranged to be responsive to the binary prediction unit and adapted to generate a module failure alert for the module if the evaluation determines that the module does not have at least the minimum probability of operating without a failure in the prediction increment.

18. The system as in claim 17 wherein the module failure alert generating unit is additionally configured to generate a positive no fault indication if the module being evaluated is likely to operate satisfactorily over the entire prediction increment.

19. The system as in claim 17 wherein the binary prediction unit comprises a model generated by machine learning from a feature set.

20. The system as in claim 17 wherein the binary prediction unit is arranged to receive feature data and uses the feature data to determine whether the module has at least a minimum probability of operating without a failure in the prediction increment.

21. A system for maintaining a light source for semiconductor photolithography, the light source comprising one or more modules, the system comprising:
an evaluation timing unit adapted to generate an evaluation signal when a module which is one of the one or more modules has reached an evaluation point on the basis of a pulse count; a binary prediction unit arranged to receive the evaluation signal and adapted to render in response to the evaluation signal a binary determination of whether the module being evaluated is likely to operate satisfactorily over the entirety of an ensuing number of pulses making up a prediction increment; and a module failure alert generating unit arranged responsively to the binary prediction unit and adapted to generate a failure alert if the binary determination is that the module being evaluated is not likely to operate satisfactorily over the entirety the prediction increment.

22. The system as in claim 21 wherein the binary prediction unit comprises a model generated by machine learning from a feature set.

23. The system as in claim 21 wherein the binary prediction unit is arranged to receive feature data and uses the feature data to determine whether the module has at least a minimum probability of operating without a failure in the prediction increment.

* * * * *